United States Patent [19]

Gambino et al.

[11] Patent Number: 5,795,826

[45] Date of Patent: *Aug. 18, 1998

[54] METHOD OF CHEMICALLY MECHANICALLY POLISHING AN ELECTRONIC COMPONENT

[75] Inventors: Jeffrey Peter Gambino, Gaylordsville, Conn.; Mark Anthony Jaso, Yorktown Heights, N.Y.; Larry Allan Nesbit, Wallingford, Conn.

[73] Assignee: International Business Machines Corporation, Armonk, N.Y.

[*] Notice: The term of this patent shall not extend beyond the expiration date of Pat. No. 5,573,633.

[21] Appl. No.: 687,273

[22] Filed: Jul. 25, 1996

Related U.S. Application Data

[63] Continuation-in-part of Ser. No. 557,225, Nov. 14, 1995, Pat. No. 5,573,633.

[51] Int. Cl.$^6$ .............................................. H01L 21/02
[52] U.S. Cl. ........................................ 438/692; 216/89
[58] Field of Search .................................. 216/89; 438/692

[56] References Cited

U.S. PATENT DOCUMENTS

| | | | |
|---|---|---|---|
| 5,008,216 | 4/1991 | Huang et al. | 437/192 |
| 5,008,730 | 4/1991 | Huang et al. | 357/58 |
| 5,143,820 | 9/1992 | Kotecha et al. | 430/314 |
| 5,244,534 | 9/1993 | Yu et al. | 156/636 |
| 5,252,516 | 10/1993 | Nguyen et al. | 437/195 |
| 5,328,553 | 7/1994 | Poon | 156/636 |
| 5,403,779 | 4/1995 | Joshi et al. | 437/190 |

OTHER PUBLICATIONS

Anonymous, "Electrical Contacts through Planar Isolation" Research Disclosure, Jul. 1990 #315, Kenneth Mason Publications, Ltd. England.

"Fully-Planarized Double-Poly Self-Aligned Bipolar Transistor with Self-Aligned Chem-Mech Polished Emitter-and Collector-Contact" IBM Technical Disclosure Bulletin, vol. 35, No. 4A, pp. 197-199, Sep. 1992.

*Primary Examiner*—Bernard Dentz
*Attorney, Agent, or Firm*—Steven Capella

[57] ABSTRACT

A method of forming interlevel studs of at least two different materials in an insulating layer on a semiconductor wafer. After forming an insulating layer of BPSG on a Front End of the Line (FEOL) structure, the BPSG layer is chem-mech polished. Vias are formed through the BPSG layer in array areas. A thin doped poly layer is deposited on the surface of the BPSG layer. The structure is annealed and vias are formed in support areas. Dopants are implanted into support areas through the vias. After annealing to diffuse implanted dopant, a metal layer is formed on the poly layer. Then, the structure is chem-mech polished back to the poly layer. A final chem-mech polish step removes the poly layer, leaving metal studs in the support areas and poly-lined metal cored studs in the array areas.

9 Claims, 3 Drawing Sheets

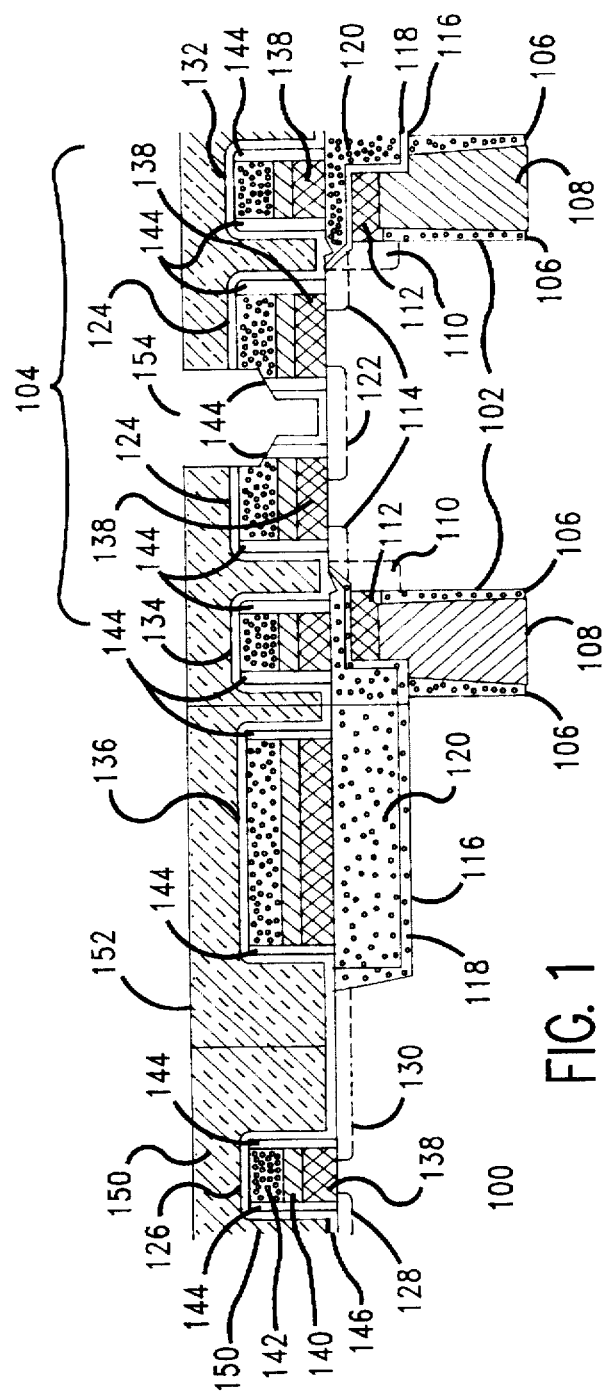
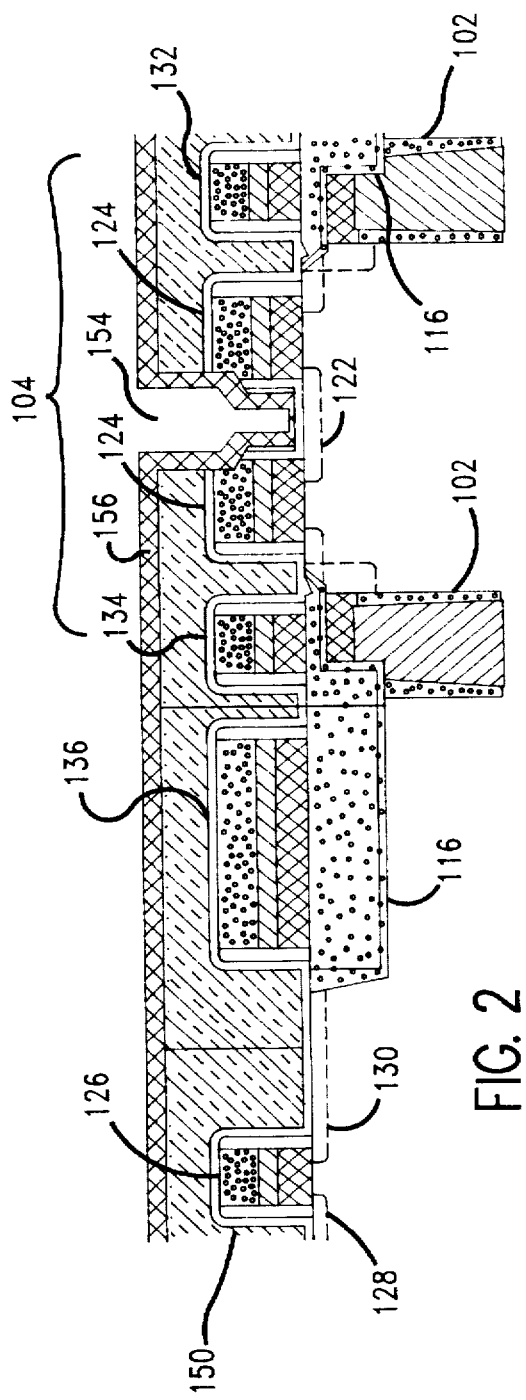
FIG. 1
FIG. 2

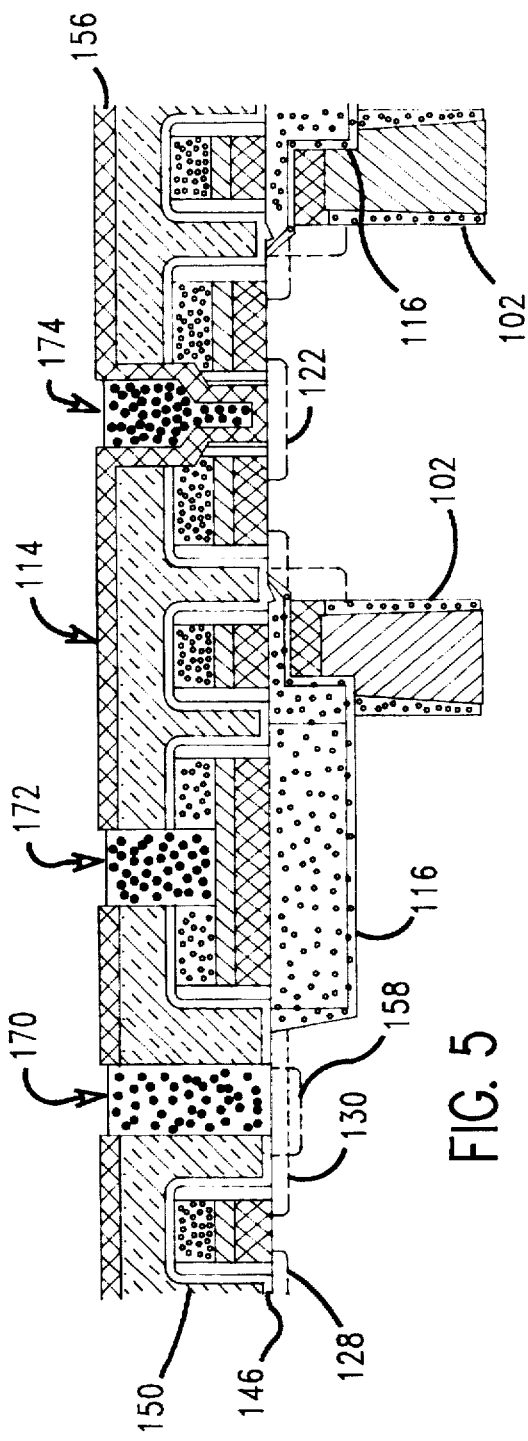
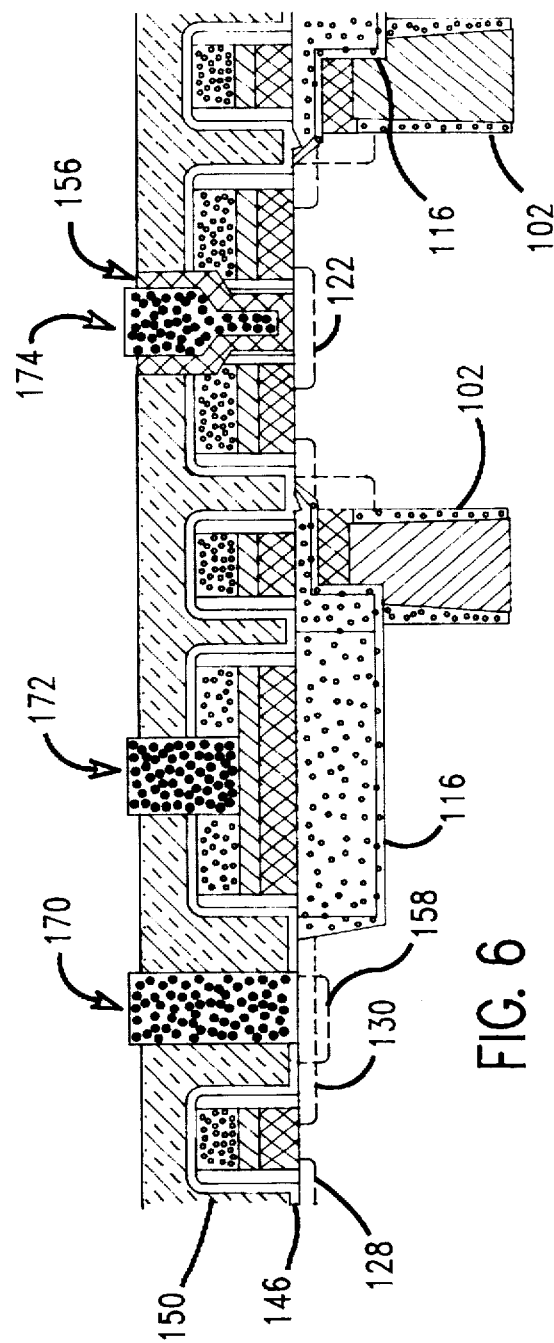

METHOD OF CHEMICALLY MECHANICALLY POLISHING AN ELECTRONIC COMPONENT

This application is a Continuation-in-Part application of application Ser. No. 08/557,225 filed on Nov. 14, 1995, now U.S. Pat. No. 5,573,633, assigned to the Assignee of the present application.

FIELD OF THE INVENTION

The present invention relates to an improved surface preparation technique for semiconductor chips and, more particularly, to the planarization of such semiconductor chip surfaces according to an improved chemical-mechanical polishing technique.

Background of the Invention

A semiconductor chip is an array of devices with conducting terminals that are interconnected by wiring patterns of metal strips. In Very Large Scale Integration (VLSI) chips, these metal wiring patterns are multilayered. Each wiring layer is separated from other conducting layers by layers of insulating material. Interconnections between different wiring layers are made by through holes (vias) that are etched through the insulating material layers.

As VLSI chip features shrink and the number of wiring layers increases, surface irregularities in each layer translate to subsequent layers, making each subsequent layer's surface even more irregular. These irregularities distort shapes formed on the irregular surface, making level-to-level alignment difficult. In some cases, this distortion is so severe as to make it nearly impossible to adequately replicate (print) the intended shape or align the level to previous levels. One way surface irregularities were reduced was to fill the vias with conductive material (i.e., form studs in the vias) before printing the wiring pattern on the surface. However, even after using studs, the raised wire shapes on the surface still caused irregularities in subsequent layers's surfaces. Therefore, techniques have been developed that are used at various levels to create a nearly, perfectly flat, or planar, surface in order to achieve high dimensional and geometric accuracy. These techniques are known, in the art, as planarization techniques or processes.

One such planarization process is Chemical-Mechanical Polishing, also known as Chem-Mech Polishing or CMP. CMP involves applying an abrasive in a solution (known as a slurry) to the wafer surface and, then, polishing the surface. Additives in the solution chemically react with the surface material, softening it, and, then, the highest features in the softened surface are removed by the abrasive particles.

When the layer to be polished is a uniform material with an irregular surface topography, CMP is a relatively simple process. Thus, CMP is widely used in the prior art to planarize insulating dielectrics in the top most semiconductor chip layers, i.e, those closest to the chip's upper surface. These top most layers are sometimes called Back End Of the Line (BEOL) layers, likening to the semiconductor chip manufacturing process to an assembly line where these steps occur at the back of the line. Likewise, early processing steps are at Front End Of the Line (FEOL) and early layers are FEOL layers; and middle steps/layers are Middle Of the Line (MOL).

CMP also is used to form studs in interlevel vias between conducting layers, such as between two wiring layers. To form studs: first, the dielectric layer may be planarized using CMP; next, the via pattern is opened through the dielectric layer; a layer of conducting material, such as polysilicon or tungsten, is formed over the patterned dielectric; and, finally, the layer of conducting material is polished down to the dielectric layer so that the conducting material remains only in the vias.

Unfortunately, after CMP, scratches may remain in the polished dielectric layer. Further, the polishing step may have failed to remove 100% of the surface irregularities caused by underlying layers. Further, because of depressions left in the surface, CMP may not have to remove all unwanted conducting material. Finally, each polishing step introduces some non-uniformity in the polished layer. These shortcomings may cause chip defects, e.g., leakages and shorts, surface irregularities, and non-uniform dielectric.

Purposes of the Invention

It is a purpose of the present invention to improve semiconductor chip yield.

It is another purpose of the present invention to simplify chip manufacture.

It is yet another purpose of the present invention to improve surface planarity of semiconductor chip layers.

It is yet another purpose of the present invention to simplify planarization of insulator layers formed in manufacturing semiconductor chips while improving chip yield.

SUMMARY OF THE INVENTION

The present invention is a method of forming interlevel studs of at least two different materials in an insulating layer on a semiconductor wafer. After forming an insulating layer of BPSG on a Front End of the Line (FEOL) structure, the BPSG layer is chem-mech polished. Vias are formed through the BPSG layer in array areas. A thin doped poly layer is deposited on the surface of the BPSG layer. The structure is annealed and vias are formed in support areas. Dopants are implanted into support areas through the vias. After annealing to diffuse implanted dopant, a metal layer is formed on the poly layer. Then, the structure is chem-mech polished back to the poly layer. A final chem-mech polish step removes the poly layer, leaving metal studs in the support areas and poly-lined Metal-cored studs in the array areas.

BRIEF DESCRIPTION OF THE DRAWINGS

FIG. 1 is a cross-sectional representation of a semiconductor chip subsequent to forming openings (vias) in array areas according to the preferred embodiment of the present invention.

FIG. 2 is a cross-sectional representation of the semiconductor chip of FIG. 1 after poly silicon deposition according to the preferred embodiment of the present invention.

FIG. 5 is a cross-section of the preferred embodiment after polishing metal from the surface thereof to re-expose the poly silicon layer.

FIG. 6 is a cross section of the preferred embodiment of the wafer prepared according to the preferred embodiment after polishing to remove the exposed poly silicon.

DESCRIPTION OF THE PREFERRED EMBODIMENTS

Figure 3:
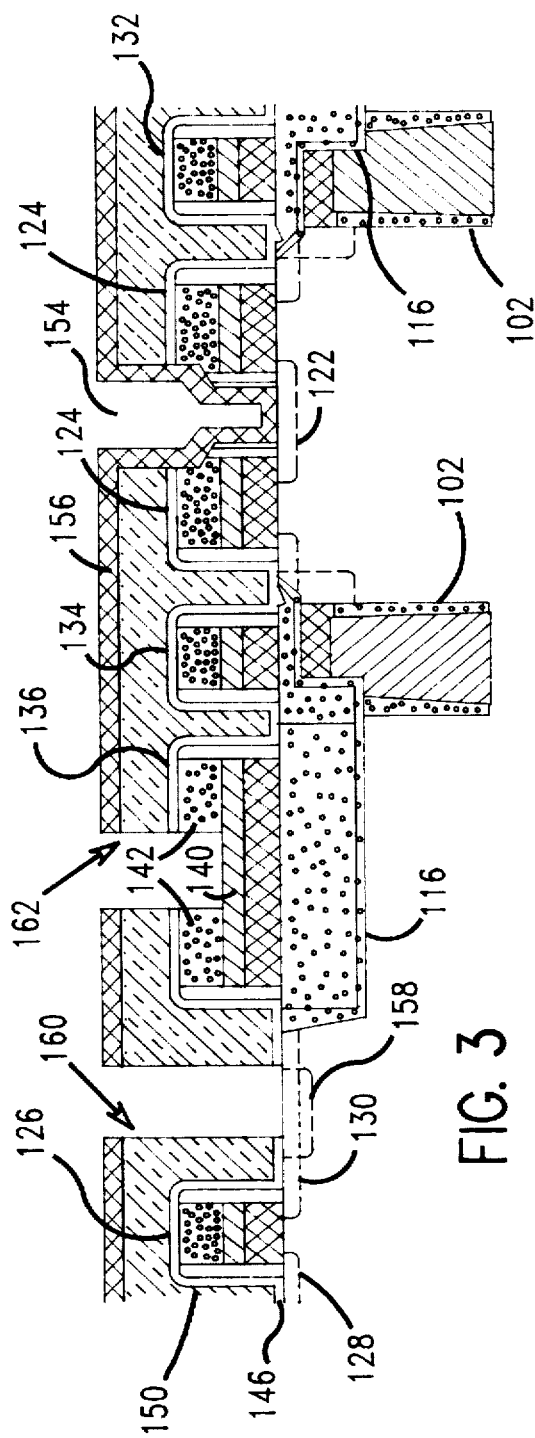
FIG. 3 is a cross-sectional representation of a semiconductor chip after forming vias for metal studs.

FIG. 1 is a cross section of a typical semiconductor chip on a semiconductor wafer. The semiconductor wafer or substrate 100 is silicon. Deep trenches 102 extend into the substrate 100 in array areas 104. The deep trenches 102 are lined with an insulating material 106 and filled with doped polysilicon (poly) 108. The doped poly 108 in the trench 102 is strapped to a buried diffusion 110 by a poly strap 112. The buried diffusion 110 connects the poly straps 112 to source diffusions 114.

A shallow trench 116 isolates the array cells from each other and the array area 104 from support circuit area. The shallow trench is lined with one or more insulating materials 118 and, then, filled with another insulating material 120. In the array area, a bit line diffusion 122 is a common drain for two pass gate Field Effect Transistors (FETs) that are further defined by poly gates 124 and source diffusions 114. Outside of the array areas 104, support circuit devices are defined by poly gates 126 between source/drain diffusions 128, 130. Poly wiring or fill 132, 134, 136 is distributed throughout the chip. In each gate 124, 126 or wire 132, 134, 136, only the bottom layer 138 of the individual stack is poly. A layer of $WSi_2$ 140 caps the poly gates 124, 126 and poly wiring 132, 134, 136. The $WSi_2$ layer 140 is capped with $Si_3N_4$ 142. Each poly-$WSi_2$ $Si_3N_4$ stack is walled-in with spacer nitride 144. The entire wafer is covered by a nitride etch-stop layer 146.

Thus, having completed processing the wafer 100 through the FEOL, interlevel studs, connecting device structures to subsequent wiring layers, may be made according to the preferred embodiment of the present invention. Poly lined studs are formed in the array 104 and metal studs are formed elsewhere.

First, a layer of insulating material 150 is formed on the previously described FEOL structure. Although, the preferred insulating material is BoroPhosphoSilicate Glass (BPSG), any suitable insulating material may be substituted. The insulating layer is chem-mech polished to form a planar surface 152. Array vias 154 are formed in the array through the insulting layer 150, down to the point of contact with the FEOL structure, e.g., bit line diffusion 122.

Next, as represented in FIG. 2, a layer of doped poly 156 is formed to contact the lightly-doped bit-line diffusion 122. So, preferably, a layer 156 of insitu doped poly is deposited onto the FEOL structure of FIG. 1. The poly layer 156 provides a dopant source for each array diffusion that it contacts and acts as a polish stop for the subsequent metal layer that is to be formed on it. The poly layer 156 thickness is such that when it is removed, metal does not protrude substantially above the insulating layer surface 152. Preferably, the poly layer 156 is 50 nm thick. Further, it is intended that the poly layer 156 does not fill the via 154, but merely lines it. Optionally, after depositing the doped polysilicon layer 156, the wafer may be annealed at a temperature of between 800° and 1000° C. such that dopants from the poly layer 156 diffuse into the diffusion 122.

In FIG. 3, after annealing, the support vias 160, 162 are formed. First, the support via 160, 162 pattern is formed in the poly layer 156 by a typical mask and etch step such as are well known in the art. So, after the via pattern is formed in the polysilicon layer 156, resist is stripped from the poly 156. The poly then acts as an etch mask for etching vias through the underlying insulating layer 150, the Nitride Etch stop layer 146 and the $Si_3N_4$ cap 142. Alternatively, the resist is left on the poly layer 156 until after the underlying layers 142, 146 and 150 are etched. After forming the support vias 160, 162, dopants are selectively implanted into the exposed surfaces through the opened support vias 160, 162. The wafer is annealed to diffuse the implanted dopant into the contact diffusions 158. Boron is implanted into p-type diffusions and arsenic or phosphorous is implanted into n-type diffusions. This implant and anneal step insures an ohmic contact between the metal stud and the diffusion thereunder.

Figure 4:
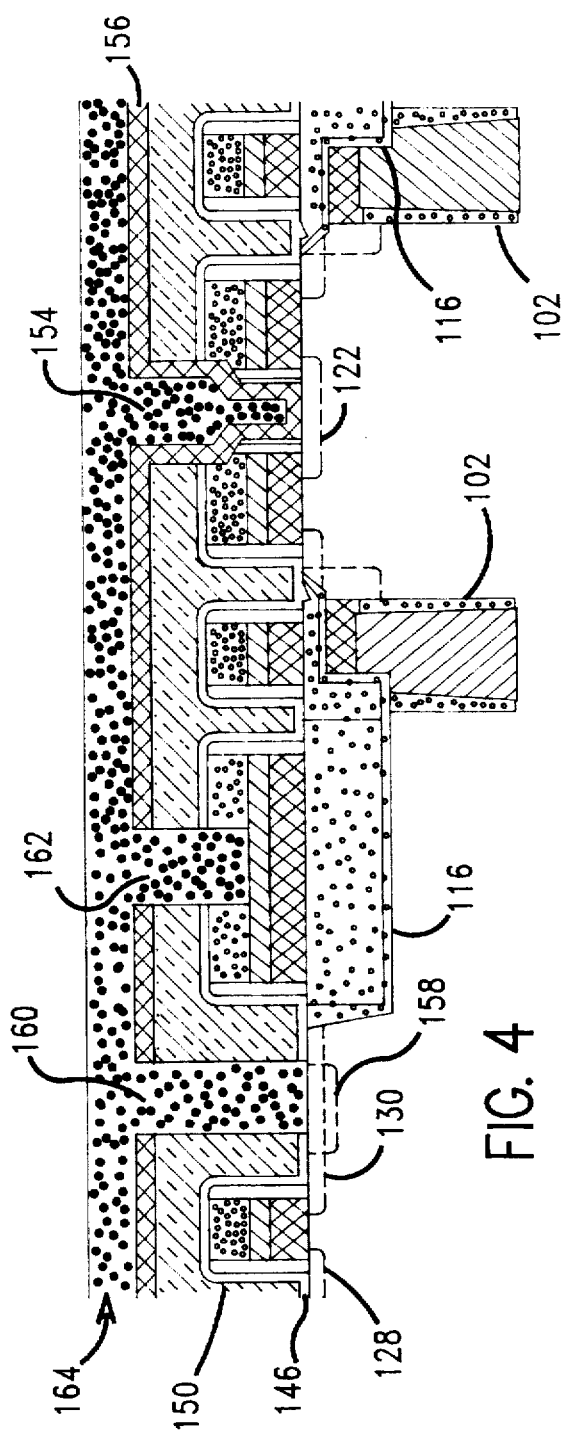
FIG. 4 is a cross-sectional representation of a semiconductor chip after depositing a metal layer.

Next, in FIG. 4, a metal blanket layer 164, preferably of Tungsten and Titanium and/or TiN, is/are deposited onto the poly layer 156 to fill the poly lined array vias 154 and the opened support circuit vias 160 and 162. The metal layer 164 is chem-mech polished down to the poly layer 156, such that metal is left only in the vias 154, 160 and 162 forming the studs 170, 172, and 174 in FIG. 5.

Finally, the exposed portions of the poly layer 156 are chem-mech polished away leaving the planarized structure of FIG. 6. Studs 170 and 172 are metal. Stud 174 has a metal core lined with the remainder of poly layer 156.

Normally, the array studs 174 would have been formed by filling the via 154 with poly and then the fill material would be polished back to the insulator, 150. This is an additional polish/CMP operation avoided by the present invention. Further, this additional polish/CMP operation introduced additional variation in the thickness of the insulator layer, 150 which resulted in additional focus and critical dimension control variations in the support vias, 160 and 162. However, the structure of FIG. 6 has a more uniform MOL insulator layer and a more planar surface after forming both via types than prior art structures. The resulting MOL insulator layer 150 has a more uniform thickness than a like structure formed by prior art methods. The additional variation in insulator thickness also placed additional constraints on the etch used in forming the support vias, 160 and 162. These additional constraints are also avoided by the present invention.

Also, the present invention eliminates separately polishing the metal back directly to a glass (such as BPSG) because of the presence of the poly layer 156. It is often difficult to remove metal imbedded in scratches found in a previously polished BPSG. Further, the poly layer 156 forms a rigid layer that minimizes reflow of the BPSG during subsequent hot processing, such as during the anneal wherein the dopant implanted into the contact openings is activated/diffused. Further, because the array studs 174 formed according to the present invention are poly with a metal core, they are lower in resistance than array studs formed purely from poly.

While the present invention is described in terms of preferred embodiments, it is understood that numerous variations and modifications will occur to a person skilled in the art without departing in spirit and scope from the claimed invention. It is intended that the scope of the claims include those modifications and variations that fall within the spirit of the invention.

We claim:

1. A method of forming interlevel studs through a planar insulating layer on a semiconductor wafer, said method comprising the steps of:

a) forming a first group of vias through a planar surface of an insulating layer;

b) forming a layer of a first conductive material on said planar surface;

c) forming a second group of vias through said first conductive material layer and said insulating layer;

d) forming a layer of a second conductive material, said layer of second conductive material filling said first and second group of vias;

e) removing said second conductive layer to expose said first conductive material layer, such that said second conductive material remains only in said first and second via groups; and.

f) removing said exposed first conductive material layer.

2. The method of claim 1 wherein the first conductive material is polysilicon and the second conductive material is a metal.

3. The method of claim 2 wherein the removing step (e) comprises chem-mech polishing the metal layer.

4. The method of claim 3 wherein the polysilicon layer is doped poly and, before the step (c) of forming the second group of vias, further comprising the step:

b1) annealing the semiconductor wafer such that dopant diffuses from the doped poly into the substrate.

5. The method of claim 4, before the step (d) of forming the metal layer further comprising the step:

c1) implanting a dopant into said wafer through said second group of vias and annealing the semiconductor wafer.

6. A method of forming interlevel studs through a planar insulating layer on a semiconductor wafer, said method comprising the steps of:

a) etching a first group of vias through a planar surface of an insulating layer, said insulating layer being a BPSG layer;

b) depositing a polysilicon layer on said planar surface;

c) etching a second group of vias through said polysilicon layer and said BPSG layer;

d) implanting dopant into said wafer through said second group of vias and annealing said wafer;

e) forming a metal layer on said polysilicon layer, said metal layer filling said first and second group of vias;

f) chem-mech polishing said metal layer to expose said polysilicon layer, such that metal remains only in said first and second via groups; and g) chem-mech polishing said exposed polysilicon layer from said BPSG layer.

7. The method of claim 6 wherein polysilicon is doped poly and the step (b) of depositing the doped poly layer includes annealing the wafer to diffuse dopant from the doped poly into the substrate.

8. The method of claim 6 wherein said deposited poly layer lines said first group of vias such that studs formed in said first group of vias are poly lined with a metal core.

9. The method of claim 6 wherein the implanting step (d) comprises implanting a first dopant into a plurality of said second group of vias and a second dopant into the remainder of said second group of vias.

* * * * *